United States Patent
Kimura et al.

[11] Patent Number: 5,929,723
[45] Date of Patent: Jul. 27, 1999

[54] SURFACE ACOUSTIC WAVE APPARATUS HAVING AN ELECTRODE THAT IS A DOPED ALLOY FILM

[75] Inventors: Noritoshi Kimura; Masahiro Nakano; Michiyuki Nakazawa; Katsuo Sato, all of Tokyo, Japan

[73] Assignee: TDK Corporation, Tokyo, Japan

[21] Appl. No.: 08/836,437

[22] PCT Filed: Sep. 13, 1996

[86] PCT No.: PCT/JP96/02623

§ 371 Date: May 7, 1997

§ 102(e) Date: May 7, 1997

[87] PCT Pub. No.: WO97/11526

PCT Pub. Date: Mar. 27, 1997

[30] Foreign Application Priority Data

Sep. 21, 1995 [JP] Japan .................................. 7-243129
Nov. 14, 1995 [JP] Japan .................................. 7-295050

[51] Int. Cl.⁶ .......................... H03H 9/145; H03H 9/64
[52] U.S. Cl. ...................... 333/193; 310/313 R; 310/363
[58] Field of Search .................... 310/313 R, 363; 333/193–196

[56] References Cited

U.S. PATENT DOCUMENTS

| | | | |
|---|---|---|---|
| 4,775,814 | 10/1988 | Yuhara et al. | 310/364 X |
| 4,906,885 | 3/1990 | Kojima et al. | 310/363 X |
| 5,144,185 | 9/1992 | Yuhara et al. | 310/363 X |
| 5,162,690 | 11/1992 | Ieki t al. | 310/363 X |
| 5,558,711 | 9/1996 | Sakurai | 117/84 |
| 5,773,917 | 6/1998 | Satoh et al. | 310/364 |

FOREIGN PATENT DOCUMENTS

| | | |
|---|---|---|
| 62-82806 | 4/1987 | Japan . |
| 3-14305 | 1/1991 | Japan . |
| 6-350373 | 12/1994 | Japan . |
| 7-111436 | 4/1995 | Japan . |
| 7-122961 | 5/1995 | Japan . |
| 8-139050 | 5/1996 | Japan . |

OTHER PUBLICATIONS

"Improved Metallization for Surface Acoustic Wave Devices", J.I. Latham, W.R. Shreve, N.J. Tolar and P.B. Ghate, thin Solid Films, vol. 64, pp. 9–15, Apr. 1979.

"Power Aging Test of SAW Filter for Portable Telephone Antenna Duplexer", T. Tabuchi, K. Kurosawa, H. Kojima, Y. Ishida and M. Hikita, Technical Reports of Institute of Electronics and Information Communication Engineers of Japan, US 87–18, Jul. 23, 1987.

"FEM Estimation of Equivalent Stress in SAW Device Electrodes", T. Kawakatsu, T. Okada and H. Ieki, Technical Reports of Institute of Electronics and Information Communication Engineers of Japan, US 90–70/EA–90–83, Jan. 25, 1991.

*Primary Examiner*—Robert Pascal
*Assistant Examiner*—Barbara Summons
*Attorney, Agent, or Firm*—Frishauf, Holtz, Goodman, Langer & Chick, P.C.

[57] ABSTRACT

In the electrode of a surface acoustic wave apparatus, the element concentration of copper in the aluminum alloy film is higher in the neighbors of grain boundary than the concentration within the crystal grain, and segregates to the neighbors of crystal grain boundary. In the electrode of this surface acoustic wave apparatus, the concentration of copper existing in the form of copper element, rather than in the form of intermetallic compound of copper and aluminum precipitated to the crystal grain boundary, is higher in the crystal grain boundary than the concentration within the crystal grain, and is in the segregation state. A ratio of a copper concentration in the neighbors of grain boundary to a copper concentration within the crystal grain in an aluminum alloy film forming an electrode of a surface acoustic wave apparatus is greater than 1.6. It is preferable that an electrode formed on a surface of the piezoelectric substrate is made of an aluminum alloy film doped with a copper in a range from 0.5 wt % to 2 wt %.

6 Claims, 10 Drawing Sheets

SURFACE ACOUSTIC WAVE APPARATUS HAVING AN ELECTRODE THAT IS A DOPED ALLOY FILM

TECHNICAL FIELD

The present invention is related to a surface acoustic wave apparatus and its manufacturing method. More particularly, the present invention relates to a surface acoustic wave apparatus including electrode films having an improved electric power-durability, and to a method for manufacturing the surface acoustic wave apparatus.

BACKGROUND ART

A surface acoustic wave apparatus, in particular a surface acoustic wave filter has found a wide use for a RF band-pass filter in a mobile telephone and/or a handy telephone, etc. in place of a dielectric band-pass filter. The reasons for that may be that surface acoustic wave apparatus, in particular surface acoustic wave filters are smaller in size than dielectric filters, and also shows improved electric characteristics as compared with dielectric filters of the same sizes.

A surface acoustic wave apparatus includes at least a piezoelectric substrate, an electrode pattern consisting of a metal film formed on a surface of the piezoelectric substrate, and a package accommodating the piezoelectric substrate and the electrode pattern. The piezoelectric substrate is made of a material, such as a lithium niobate, a lithium tantalate, or a quartz, an electrode pattern of a film of a metal, such as aluminum being formed thereon and accommodated into the package.

In FIG. 5, there is shown a manufacturing process of a conventional prior art surface acoustic wave apparatus. First, a piezoelectric substrate 50 is provided by being cleaned in the process (a), and a metal film 51 is formed thereon by means of a vapor-deposition or a sputtering to provide an electrode material in the process (b). A coating of a photo-resist is then provided thereon, for example, by means of a spin coat method. Then, as shown in the process (c), exposure to a desired pattern is made by an exposing machine, and after development, obtain a photoresist pattern 52. Thereafter, in the process (d), a wet-etching or a dry-etching method is carried out to form a metal film of a desired electrode pattern 53. The photoresist used for the pattern formation is, in the process (e), removed using a removing agent, or by means of an ashing method. Thus, a pre-process, which is so-called photo-process, has been completed. Thereafter, in the process (f), the piezoelectric substrate formed with the electrode pattern thereon is cut into chips by dicing. Then, in the process (g), after having fixed the cut chips on the package using an adhesive, bonding wires are attached thereto in the process (h). Finally, in order to secure a hermeticity, a lid is welded to the package in the process (i), an electrical characteristic test is made in the process (j) to complete the post-process.

The surface acoustic wave apparatus has a problem such that, when in use for the RF band around 1 GHz, an electrode width and an electrode gap of a comb-shaped electrode must be of very small values, such as about 1 micrometer, thereby its life time (hereinafter, referred to as life) is very short. A factor of determining the life for the surface acoustic wave apparatus is mainly a power-durability of the electrode film. Placing the surface acoustic wave apparatus in an operating state, the electrode film on the piezoelectric substrate is subjected to a stress which is repeated with a frequency that is equal to an operating frequency. Due to this repetitive stress applied to the electrode film, defects such as hillocks (projections) and voids (depletions) will be generated on the electrode film by migrations, thereby significantly degrading the characteristics of the surface acoustic wave apparatus. This degradation phenomena of electrode film will be more pronounced for higher operating frequency, and for larger applied electric powers. Further, as a matter of design, for higher operating frequency, it is necessary to make the electrode film thinner and to make the electrode width narrower. With such additional factors, in a design for higher operating frequency, defects would be easily generated on the electrode film, and as a consequence, resulting in a poor power-durability.

As the electrode film for the surface acoustic wave apparatus, aluminum (Al) has been at first used because of its small specific gravity, its small electric resistivity, etc. However, when aluminum (Al) is used for the electrode film, problems of the above mentioned degradation of the electrode film have arisen in designs for higher operating frequency. As a means for improving the degradation phenomena of the electrode film caused by this migration, there has been proposed to use an aluminum-copper alloy (Al—Cu) formed by adding a small amount of a different kind of metal such as copper (Cu) to aluminum (Al) as disclosed by J. I. Latham, et al. (See, Thin Solid Films, 64, pp. 9–15, 1979). With this aluminum alloy, the generations of hillocks and voids can be suppressed, and the power-durability of the surface acoustic wave apparatus has been enhanced.

Meanwhile, the occurrence of degradation caused by migration of aluminum has also been a problem in the field of semiconductor. As the migration of aluminum in the semiconductor wiring, mainly two kinds are known such as an electro-migration produced by an electric current, and a stress-migration produced by a residual stress resulted from making the multiple-layers of thin films. As distinct from a circumstance in the field of semiconductor, the surface acoustic wave apparatus is subjected to a stress which is repeated with a frequency equal to an operating frequency, as mentioned above. In the article "METAL-MIGRATION OF ALUMINUM THIN FILM ON SAW RESONATOR", the Journal of Institute of Electronics, Information and Communication Engineers of Japan, Vol. J67-C, No. 3, pp. 278–285, 1984, Ebata and Morishita describe about the migration of aluminum in details. The migration of aluminum has been a problem in the semiconductor wiring at first. The migration for the semiconductor wiring is classified roughly into the electro-migration (EM) caused by a direct current and the stress-migration (SM) caused by a residual stress which has been produced in forming multiple-layers wiring. In this article, the causes of migrations produced in the surface acoustic wave apparatus are clearly explained. According to this explanation, a shield electrode is connected to so that it is grounded between two interdigital transducers (IDT) in a manner that an excitation by and receipt of the surface acoustic wave (SAW) will not be made, a streak pattern corresponding to the standing wave of the surface acoustic wave (SAW) is formed in the operation on the shield electrode. This streak pattern forms the voids and hillocks caused by the migration of aluminum. In this case, it has been verified that no current flows through the shield electrode and that a stress produced by the standing wave of surface acoustic wave is the cause for this streak. Therefore, it could be said that the migration produced in the aluminum in case of surface acoustic wave apparatus is an acoustic migration which differs from the EM, SM produced by the current or the residual stress. On one hand, since the repetitive stress corresponding to the surface acoustic wave will act on the surface acoustic wave electrode, this phenomena could be called as a metal fatigue. It is said that this stress is of a value equivalent to or greater than the tensile stress (fatigue limit) of aluminum in the form of block.

In a RF interstage filter for a handy telephone, the electric power applied to the transmitting side is different from that to the receiving side, and generally the electric power applied to the receiving side is smaller than that to the transmitting side. However, even in the case of a receiving side filter having a smaller applied electric power, it is required that its life should be more than 10 years in the room temperature 25° C., with 0.1 W applied electric power. In providing this filter in the form of a surface acoustic wave apparatus, more particularly, in the form of a multiple-mode type surface acoustic wave filter, when a pure aluminum film is used as an electrode material according to a conventional technology, the life is merely a few years, thereby a specification of equal to or more than 10 years could not be satisfied.

Thus, the inventors of the present application had conducted durability tests of multiple-mode type surface acoustic wave filters wherein use is made, as the electrode material, of the aforementioned aluminum-copper alloy film (Al-0.5 wt %Cu) which is said to be a high power-durability. Samples used in the tests were selected from those which had been designed as the filters in the receiving side (the center frequency is 947.5 MHz) of the GSM system which was in a rapidly widespread use mainly in Europe. Further, during the life test, due to the defects such as voids and hillocks generated in the electrode film, there will be an increase in the film resistance of that electrode film so that there will be an increase in insertion loss. Therefore, taking a TF (Time to Failure) as a measure of the element life, the element life being defined as a time until which the insertion loss is increased by 0.5 dB, the life test was conducted by changing the applied power and the ambient temperature. As a result, under the applied power of 0.1 W and in the ambient temperature of 25° C. which are the requirements in GMS, the estimated element life is about 30 years for the multiple-mode type surface acoustic wave filter which is used as the sample.

From the above mentioned results, also in the multiple-mode type surface acoustic wave filter, it has been found that a sufficient power-durability could be obtained by using the aluminum-copper alloy film (Al-0.5 wt %Cu) as the electrode material. However, because a relatively large power will be applied in the filter of the transmitting side and in the antenna duplexer, for examples, there has been a problem that a sufficient life may not be obtained with the above mentioned power-durability of the electrode film.

As means for improving the life, a study of a power-durability of an aluminum-copper alloy film has been disclosed by Tabuchi, et al, in "THE POWER AGING TEST OF SAW FILTER FOR PORTABLE TELEPHONE ANTENNA DUPLEXER", Technical Reports of Institute of Electronics and Information Communication Engineers of Japan, US 87-18. According to this report, in an aluminum-copper alloy film, the life will be improved by increasing copper concentration. Further, such improvement of the life can be observed as the copper concentration is increased up to 2.5 wt %, but on the contrary, the life will be shortened by doping the copper beyond the value. In this manner, it is known that electrode materials consisting of an aluminum-copper alloy film show the most significant power-durability with 2.5 wt % concentration of copper. However, an increase in the copper concentration will cause a problem in manufacture on the grounds described below.

First, it has been well known that a large galvanic local cell will be formed with a combination of an aluminum and a copper, so that this local cell will tend to accelerate a corrosion of the electrode film during a manufacturing process, in particular, in the photolithography, etching, etc. Further, presently, in the etching, a dry-etching using a chlorine plasma gas is commonly utilized since it can form a very small electrode with high accuracy. When applying a dry-etching technique to this aluminum-copper alloy film, problems are encountered in that the etching is difficult to be carried out because of a high boiling point of chlorides of copper and that electrode corrosion is apt to be generated after the dry-etching because of possible residual chlorides of copper.

In FIG. 7, there are illustrated experimental results of the electrode corrosion occurrence which has been generated after the dry-etching using a chlorine gas plasma. In FIG. 7, the abscissa indicates copper concentration in the aluminum-copper alloy film, and the ordinate indicates the number of corrosions generated within an area of 25 micrometers×25 micrometers. As can be seen from the figure, the electrode corrosion, which will not be generated in a pure aluminum film, becomes more pronounced by alloying it with the copper. It should be noted that up to 0.5 wt % of the copper concentration the electrode corrosion is hardly generated, but beyond that value, it will increase exponentially with the doped amount of the copper. That is to say, increasing the doped amount of copper in order to enhance the power-durability of the aluminum-copper alloy film will in turn make the problem of the electrode corrosion more serious during the manufacturing process.

On one hand, as another means for enhancing the power-durability of the aluminum-copper alloy film, reference may be made to the three-layer laminated structure electrode which is disclosed in the Japanese Patent Application Public Disclosure No. 7-122961. This publication discloses a structure having a pair of aluminum films with a copper layer inserted therebetween. According the teaching of this publication, the power-durability can significantly be improved by means of the three-layer laminated structure comprised of an aluminum-copper alloy film-copper-an aluminum-copper alloy film, as compared with the conventional aluminum-copper alloy film. However, with this three-layer structure, although the power-durability can be significantly improved, there is a problem regarding an ease of manufacture. In this structure, since the copper exists in the mid-layer, it is apparent that the above mentioned problem of the electrode corrosion due to aluminum and copper will become more serious than the one in the aluminum-copper alloy film. Further, for aluminum copper, etchants to be used in the etching, i.e., the compositions of the etching liquid for wet-etching or the type of etching gas for dry-etching must be different, so that for producing the three-layered structure, an apparatus will be very extensive. Also in an electrode material filming, it must go through the filming processes of forming the three-layers so that there is a problem that the manufacturing cost will be more expensive.

DISCLOSURE OF THE INVENTION

Accordingly, the object of the present invention is to provide a surface acoustic wave apparatus and its manufacturing method with an enhanced power-durability of an electrode thin film, using a conventional aluminum-copper alloy for an electrode material, without altering its alloy compositions, or its structure.

Another object of the present invention is to provide a surface acoustic wave apparatus and its manufacturing method with an enhanced power-durability, having an ease of manufacturing and no problem of an electrode corrosion.

Furthermore, another object of the present invention is to enhance the power-durability by a simple means, in a surface acoustic wave apparatus utilizing as an electrode material, an alloy system which is not limited to an aluminum-copper alloy but has a very small solid solution limit of an additive element to a base electrode material.

According to one aspect of the present invention, in order to achieve the above mentioned objects, improvements are effected to a surface acoustic wave apparatus including a piezoelectric substrate which is formed with an electrode consisting of an aluminum alloy film doped with a copper. The features of the surface acoustic wave apparatus according to the present invention reside in the fact that element concentration of copper is higher in the neighbors of grain boundaries comparing to the one within a crystal grain, resulting in segregation of copper to the neighbors of a crystal grain boundary. In other words, in the electrode of the surface acoustic wave apparatus according to the present invention, the features thereof are such that the concentration of copper existing in the form of copper element, rather than the form of intermetallic compound with an aluminum precipitated to the crystal grain boundary, is higher in the neighbors of crystal grain boundary than in the crystal grain, resulting in the segregation of copper to the neighbors of crystal grain boundary. Here, in most cases, intermetallic compounds of aluminum and copper precipitates to the crystal grain boundary, however, in the present invention, consideration is made not on the concentration of copper existed in the form of such compounds, but on the copper concentration existed in the state of copper element.

In a preferred embodiment of the present invention, a ratio of a copper concentration in the neighbors of grain boundary to a copper concentration within the crystal grain in an aluminum alloy film forming an electrode of a surface acoustic wave apparatus is equal to or greater than 1.6.

In a further preferred embodiment of the present invention, a ratio of a copper concentration in the neighbors of grain boundary to a copper concentration within the crystal grain in the aluminum alloy film forming an electrode of a surface acoustic wave apparatus is equal to or greater than 2.2.

In one embodiment of the present invention, it is preferable that a surface acoustic wave apparatus is formed with an electrode consisting of an aluminum alloy film doped with a copper in a range from 0.5 wt % to 2 wt %.

In another embodiment of the present invention, preferably a surface acoustic wave apparatus takes a form of a multiple-mode type surface acoustic wave filter.

The present invention also provides a method for manufacturing an improved surface acoustic wave apparatus. This method provides improvements to a method for manufacturing a surface acoustic wave apparatus comprising steps of forming a surface acoustic wave apparatus by forming an electrode pattern of a copper-doped aluminum alloy film on a piezoelectric substrate, and containing in a package the piezoelectric substrate having the electrode pattern formed thereon, and aging the alloy film, and the method for manufacturing the surface acoustic wave apparatus is characterized in that the aging process is conducted at a temperature ranging from 150° C. to 250° C., for a time less than 100 hours (excluding zero hour).

In one embodiment of the present invention, the method for manufacturing a surface acoustic wave apparatus provides an improvement to a method of manufacturing a surface acoustic wave apparatus, comprising a process of assembling a surface acoustic wave apparatus including steps of forming a copper-doped aluminum alloy film on a surface of a piezoelectric substrate; obtaining a photoresist pattern by coating, exposing and developing a photoresist on the alloy film; forming a desired electrode pattern by etching the alloy film; removing the photoresist; cutting the piezoelectric substrate on which a plurality of desired electrode patterns are formed into chips; fixing each chip to a package, and wiring with bonding wires; and hermetic sealing by welding a lid to the package; and a process of aging the alloy film. This method for manufacturing a surface acoustic wave apparatus is characterized in that the aging process is conducted at a temperature ranging from 150° C. to 250° C., for a time less than 100 hours excluding zero hour.

In the method for manufacturing a surface acoustic wave apparatus according to the present invention, preferably the aging process is conducted at a temperature ranging from 200° C. to 250° C., for 5 to 50 hours, and more preferably it is conducted at a temperature ranging from 200° C. to 250° C., for 5 to 25 hours.

In a preferred embodiment of the present invention, the aging process is conducted after having formed an alloy film on a piezoelectric substrate.

In a preferred embodiment of the present invention, the aging process is conducted after having assembled a surface acoustic wave apparatus.

Further, in another preferred embodiment of the present invention, preferably, the surface acoustic wave apparatus is a multiple mode type surface acoustic wave filter.

In a further embodiment, an electrode of surface acoustic wave apparatus has, in case of utilizing an alloy system having a dopant element with a small solid solution limit to the alloy base material, the dopant element segregated to alloy crystal grain boundaries, so that the concentration of dopant element is higher at crystal grain boundaries than within a crystal grain.

Although a migration of an electrode thin film in the surface acoustic wave apparatus seems to be, in regard to a state of electrode degradation, similar to an electromigration and a stress-migration in wiring of a conventional semiconductor apparatus, their mechanisms are different. A difference between the conventional semiconductor apparatus and the surface acoustic wave apparatus is that, in case of the surface acoustic wave apparatus, a large stress is repeatedly applied to the electrode thin film. In the report of "FEM ESTIMATION OF EQUIVALENT STRESS IN SAW DEVICE ELECTRODE", Kawakatsu et. al (Journal of Institute of Electronic, Informations and Communication Engineers US90-70/EA90-83), there are described results of calculation of various stresses to be applied to the electrode thin film on piezoelectric substrates. According to this report, a maximum stress value within the electrode will become in the order of $10^7$ Pa, thereby will become a value equal to or greater than a degree of a tensile strength of aluminum (Al). It is understood that in the case of a surface acoustic wave apparatus, besides an applied power (electric current), such a large stress is repeatedly applied so that void and/or hillock are generated by migration within the electrode, and thereby degrading a power-durability.

In order to improve the degradation phenomena of the above mentioned electrode thin film, it has been known to use an aluminum-copper alloy (Al—Cu) as an electrode material. The power-durability can be improved comparing to the electrode thin film of a pure aluminum (Al) by alloying the electrode material. There is no established theory as the reasons therefor, but the following two may be their reasons. One of them is that by adding a dopant metal such as copper (Cu) to aluminum, it is possible to obtain fine size of crystal grains, thereby enhancing the power-durability. The other theory is that by adding a dopant metal, a grain boundary diffusion of an aluminum in the migration can be suppressed, thereby enhancing the power-durability.

The inventors of the present invention have conducted a comparison test for a case of using a pure aluminum as an electrode material and for a case of using an aluminum-copper alloy as an electrode material in order to confirm the effects of alloying aluminum, and then observed the states of electrode degradation (migration) by a scanning electron microscope (SEM), reports having been made in (Proceedings of the 56th Autumn Meeting of the Japan Society of Applied Physics, 28p-L-11, 1994). As the results thereof, in case of using a pure aluminum, it is recognized that the voids have generated along the crystal grain boundary, but in case of using an aluminum-copper alloy, this generation of the voids along the crystal grain boundary is considerably suppressed, and then by continuing the test further it is confirmed that voids are produced throughout the crystal grains. From this fact, in case of a surface acoustic wave apparatus which uses an aluminum-copper alloy for an electrode material, it is understood that a dopant element for alloying suppresses a grain boundary diffusion of aluminum.

Also, as a reason for the power-durability to be enhanced by the aging process of less than 100 hours in a temperature range from 150° C. to 250° C., from the facts that there was little variation of the film stress before and after aging, and that there was no variation of a grain diameter as far as observing a crystal grain before and after aging, etc., it is understood that a certain change has occurred within the crystal grain by the aging.

In an aluminum-copper alloy (Al—Cu) in which a trace quantity of copper has been doped in aluminum, it is known that a solid solution limit of copper around a room temperature is very small (about 0.2 wt %). However, by adopting a non-equilibrium material producing condition, it is possible to produce a material having an alloy compound with a concentration greater than this solid solution limit. Specifically, a rapidly cooling method in a bulk material production, a sputter method in a thin film material production, etc. are known, and by adopting either of these publicly known methods, an aluminum-copper alloy having an alloy compound of copper concentration greater than the solid solution limit can be obtained.

An aluminum-copper alloy produced by these conditions is, as shown in FIG. 4(a), in a non-equilibrium state of which copper is forced to be in a solid solution immediately after filming. Accordingly, after filming, by conducting a process such as a heat-treatment or an aging process, as shown in FIG. 4(b), an excessively doped copper element is segregated to the neighbors of crystal grain boundary. Since this state is a metastable, by further continuing the heat-treatment operation such as the aging process, etc., as shown in FIG. 4(c), it shifts to a stable phase and precipitates an intermetallic compound, and then becomes to be in a stable state. In case of an aluminum-copper alloy, this stable phase is called as a theta phase, and the intermetallic compound precipitated to the crystal grain boundary is $CuAl_2$. In this theta phase, copper itself will not precipitate at the crystal grain boundary.

In the Japanese Patent Application Public Disclosure No. 7-122961, there is described that $CuAl_2$ precipitated to the crystal grain boundary in an aluminum-copper alloy film contributes to improved the power-durability by forming the crystal grain boundary in a mesh-like structure. More specifically, it is the description of this public disclosure that a theta phase which is a stable state as shown in FIG. 4(c) contributes to the power-durability. The present invention is intended to accomplish by an aging process, a metastable state in which Cu segregates, or the state shown in FIG. 4(b), the state being produced on the way that the stable $CuAl_2$ precipitates. In the surface acoustic wave apparatus according to the present invention, it is considered that the copper element segregated to the neighbors of the crystal grain boundaries of the electrode material contributes to improve the power-durability. In other words, it is understood that, within the crystal grain, by having Cu segregated to the neighbors of crystal grain boundaries, the Cu concentration in the neighbors of crystal grain boundary becomes larger comparing to the one within the crystal grain, so that it is possible to obtain an alloy electrode material structure with an excellent power-durability.

Referring to the accompanying drawings, the preferred embodiments of the present invention will be described in detail below.

BEST MODES FOR CARRYING OUT THE INVENTION

A surface acoustic wave apparatus of the present embodiment is a multiple-mode (longitudinally coupled double-mode) type surface acoustic wave filter having electrodes consisting of a copper doped aluminum alloy film of 0.17 micrometers thick on a lithium niobate ($LiNbO_3$) piezoelectric substrate designed in accordance with a GSM system receiving-side filter specification (central frequency is 947.5 MHz). As regards copper concentrations in electrodes, three different kinds have been prepared including 0.5 wt %, 1.0 wt % and 2.0 wt %.

Figure 5:
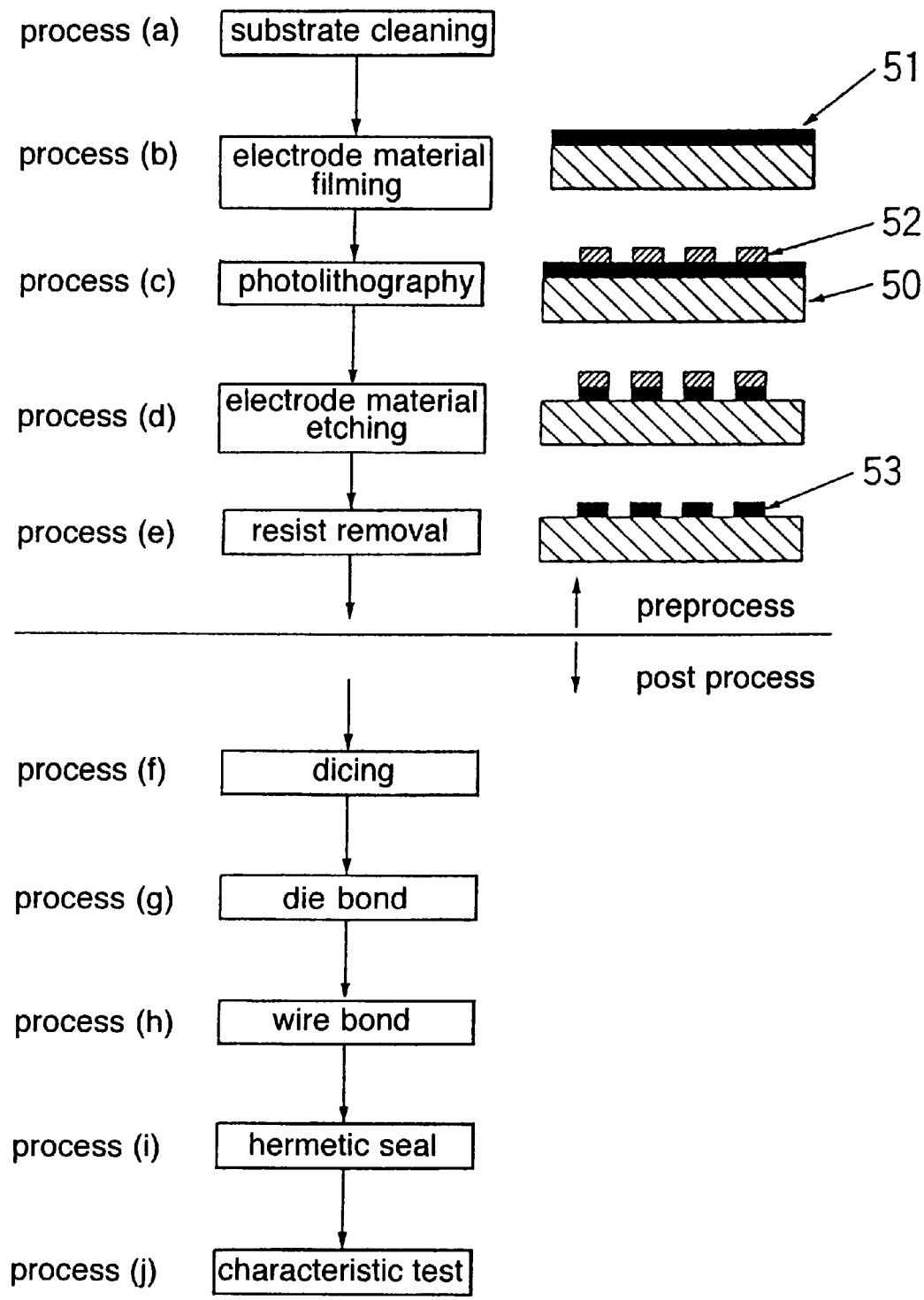
FIG. 5 is a flowchart illustrating a general manufacturing process of a surface acoustic wave apparatus.

A manufacturing method of the surface acoustic wave apparatus according to the present invention will now be described. Using a sputtering apparatus, thin film electrodes of the aluminum-copper alloys including copper of the above-mentioned doping ratios have been formed on a piezoelectric substrate of a lithium niobate ($LiNbO_3$) to a thickness of 0.17 micrometers. Thereafter, under each respective temperature conditions of 100, 150, 200, 250, 300° C., aging processes have been carried out for 5, 10, 25, 50, 100 hours. Further, in accordance with the prior art method shown in FIG. 5, patterning of electrodes is carried out by a photolithography technique, and then surface acoustic wave filters are produced through assembly processes.

Figure 6:
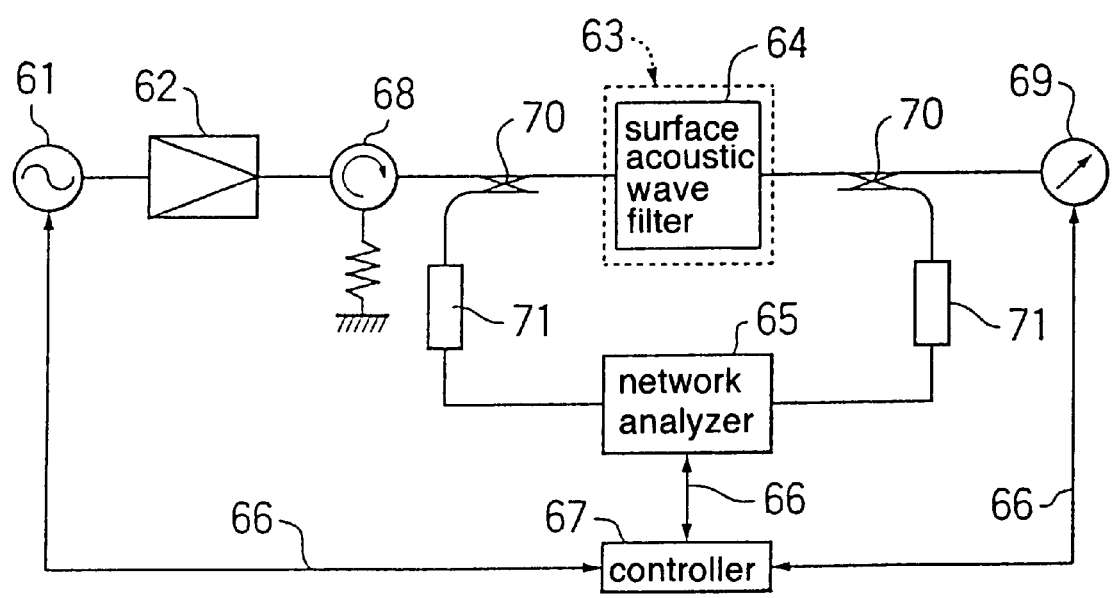
FIG. 6 is a schematic diagram showing a measurement circuit for a power-durability test.
Figure 7:
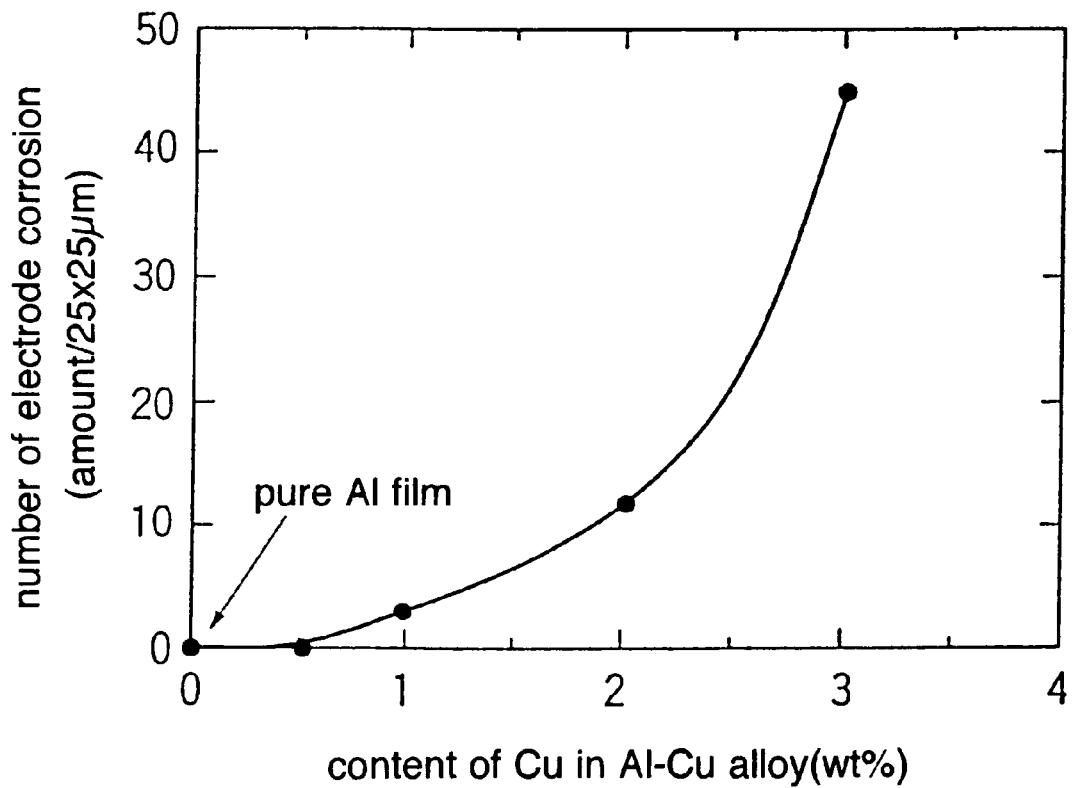
FIG. 7 is a diagram illustrating a relationship between a content of a copper in an aluminum-copper alloy film and a number of electrode corrosion having occurred after a dry-etching.

Now, life tests of the surface acoustic wave filter or an evaluation for a power-durability will be described. Test frequencies have been determined, among pass bands of the filters, as the highest ones in the frequency ranges in the bands in which a power-durability is the weakest. An acceleration test condition is set as an ambient temperature to be 80° C., an input power to be 1 W. In FIG. 6, there is shown a measurement circuit for a power-durability test used in this experiment. In FIG. 6, a RF signal generated from the frequency synthesizer 61 is amplified to 1 W in the RF mplifier 62, and then it is applied to the surface acoustic wave filter 64 placed within the 80° C. oven 63 through the isolator 68. The surface acoustic wave apparatus or the filter 64 is connected to the RF power meter 69. Then, in order to measure the electric characteristics at a time when the electric power is applied, the network analyzer 65 is connected to both ends of the surface acoustic wave filter 64 through the directional coupler 70 and the attenuator 71. In order to control the frequency synthesizer 61 and RF power meter 69, and the network analyzer 65, the controller 67 is connected to these devices by the cable 66 such as GP-IB cable. Moreover, an element life is obtained by setting a time when an insertion loss of the filter has increased by the amount of 0.5 dB as TF (Time to Failure).

Figure 2A:
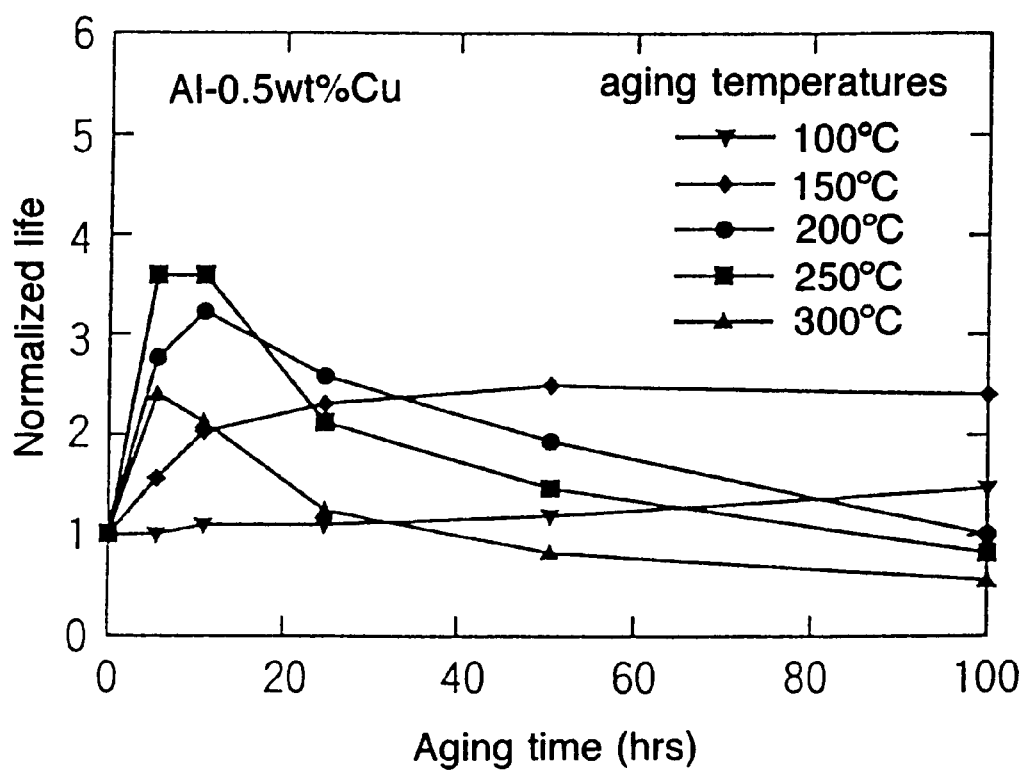
FIGS. 2(a), 2(b) and 2(c) is a diagram illustrating a relationship between a life characteristics and an aging process time in an aluminum-copper alloy film forming an electrode of a surface acoustic wave apparatus of the present invention.
Figure 2B:
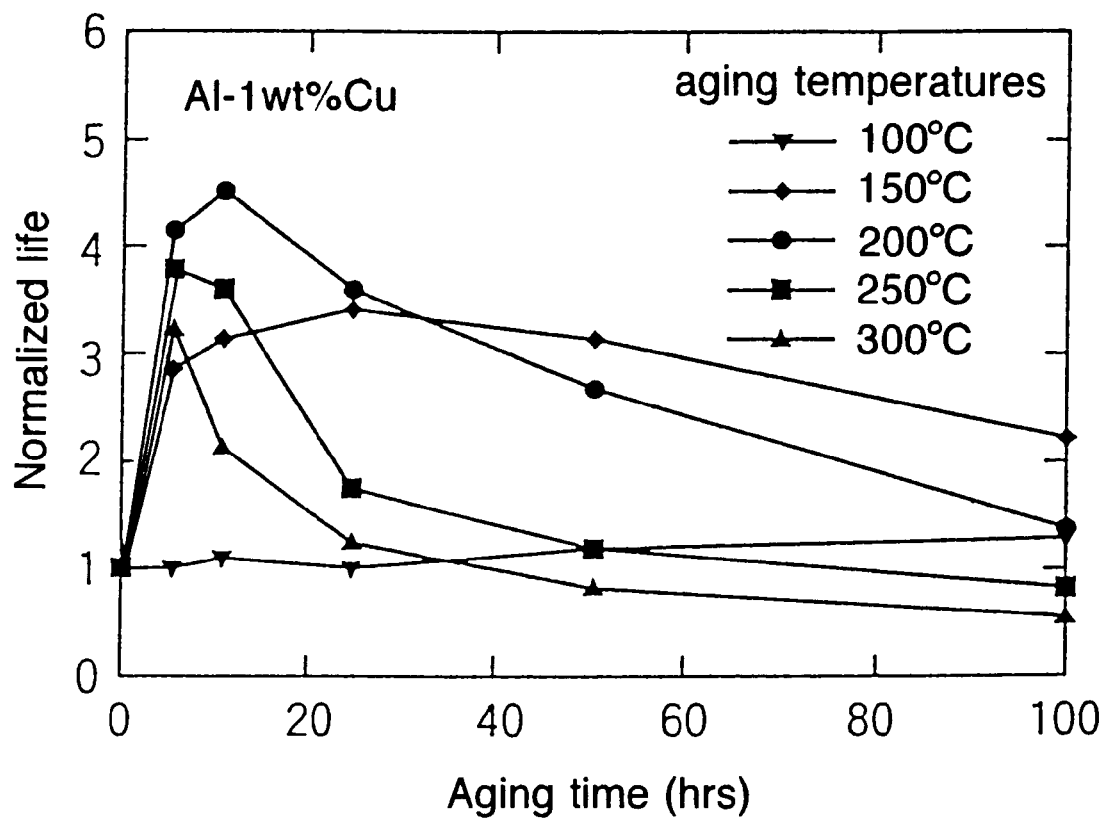
Figure 2C:
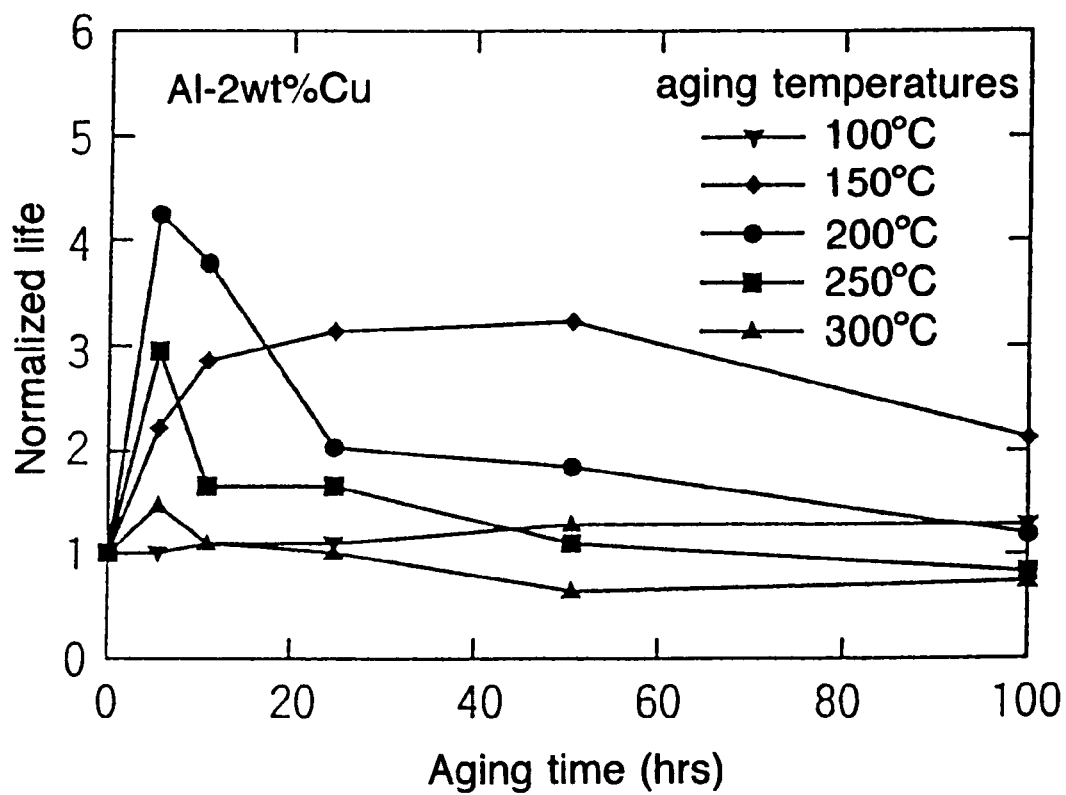

In FIGS. 2(*a*), (*b*), and (*c*) there are shown the test results of the power-durability for this aluminum-copper alloy electrode film. In each figure, the abscissa indicates the aging time for segregating the doped element to the neighbors of the crystal grain boundary, and the ordinate indicates a normalized life, respectively. Here, the normalized life is defined as a ratio between an element life (TF aging) in the event of having implemented the aging process and an element life (TF non-aging) in the event of not having done an aging process (i.e., the aging time is zero). As apparent from this figure, for the aging time being from 5 hours to 50 hours, it can be seen that the life can be increased several-times by implementing the aging process. In particular for the aging temperatures of 200° C. and 250° C., the power-durability with the aging process of the order of 10 hours shows more than 3-fold of that without the aging process.

When the aging process time exceeds 10 hours, a tendency of an enhancement of the power-durability becomes smaller. In case of the aging temperature being 150° C., it is understood that an enhancement of the power-durability can be seen when the aging process time exceeds 20 hours. In case that the aging temperature being lower than 150° C., an effect of the aging will not appear within this process time. Further, in case of the aging temperature being 300° C., at an initial of the aging, even though an effect of an enhancement of the power-durability could be recognized, during the aging or when taking out the elements from the oven, many cracks will be generated in the piezoelectric substrate, and the yields become worse. Therefore, it can not be said that this temperature is a practical aging temperature. From the above, by setting that the aging temperature to be used in the present invention is preferably in the range from 150° C. to 250° C., and that the aging time is to be less than 100 hours, preferably less than 50 hours, and more preferably less than 30 hours, it has been found experimentally that the power-durability can be improved several-fold, comparing to the ones without aging.

Also, the ratio of copper doped in aluminum have some effects on an enhancement of the power-durability. As can be understood from the comparisons in FIGS. 2(*a*), (*b*), (*c*), when the copper concentration is to be 1 wt %, a significantly improved normalized life is noted with the aging temperatures 200° C. and 250° C., and with the aging time of less than 30 hours. When the copper concentration is to be 2 wt %, a significantly improved normalized life is noted with the aging temperature 200° C. and the aging time of less than 30 hours. With the copper concentration of 0.5 wt % an effect of improvement can be recognized, but the extent of improvement is somewhat lower.

The above described embodiments are for the cases in which the aging process has been imposed after the film of the electrode materials had been formed, but it is apparent to a person skilled in the art that an equivalent effect could be obtained by implementing an aging process after assembling the apparatus.

Figure 3:
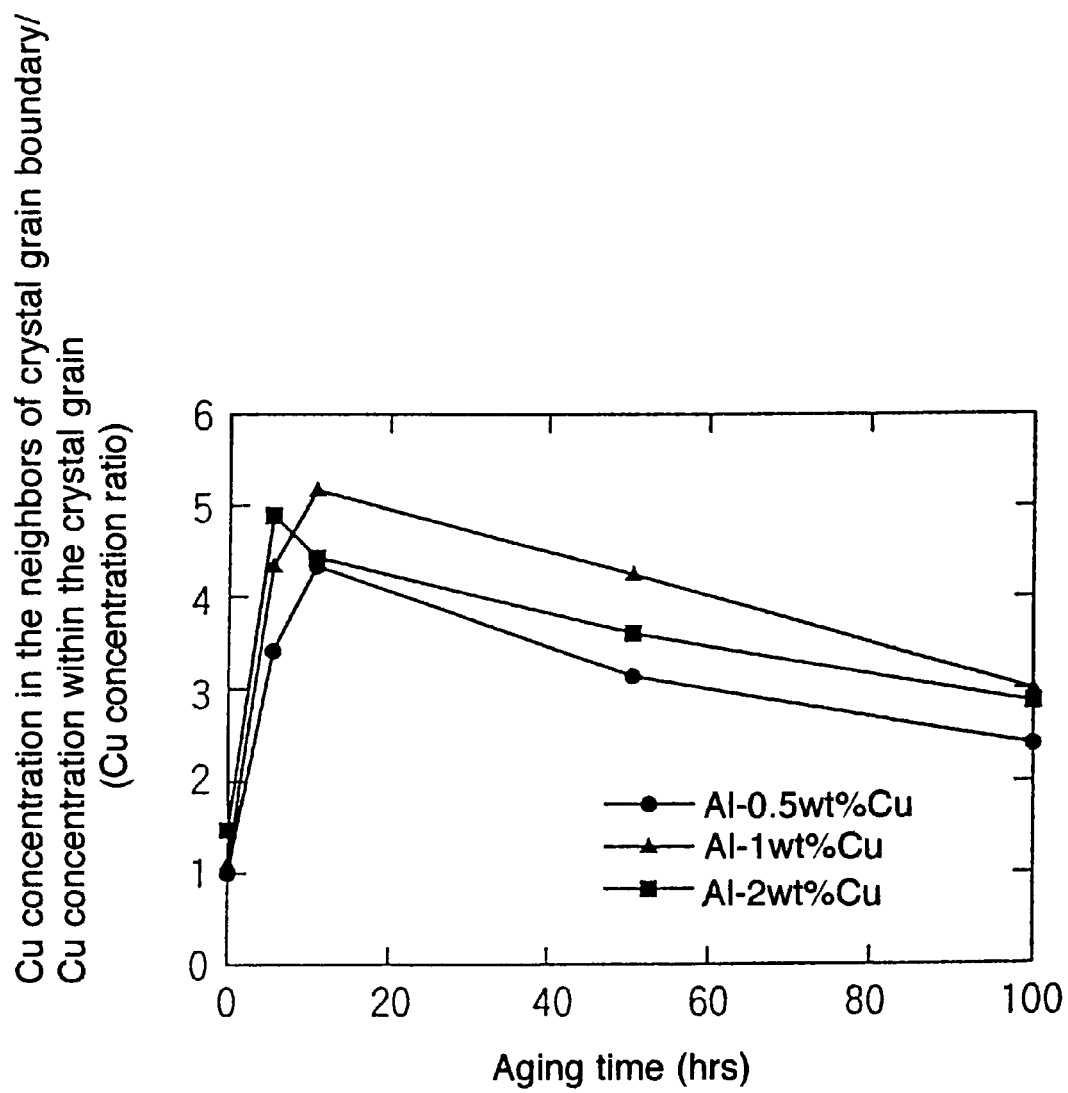
FIG. 3 is a diagram illustrating a relationship between an aging process time in an aluminum-copper alloy film forming an electrode of a surface acoustic wave apparatus of the present invention, and a ratio of a copper element concentration near a crystal grain boundary to a copper element concentration within a crystal grain or a segregation of the doped element to the neighbors of crystal grain boundary.
Figure 4A:
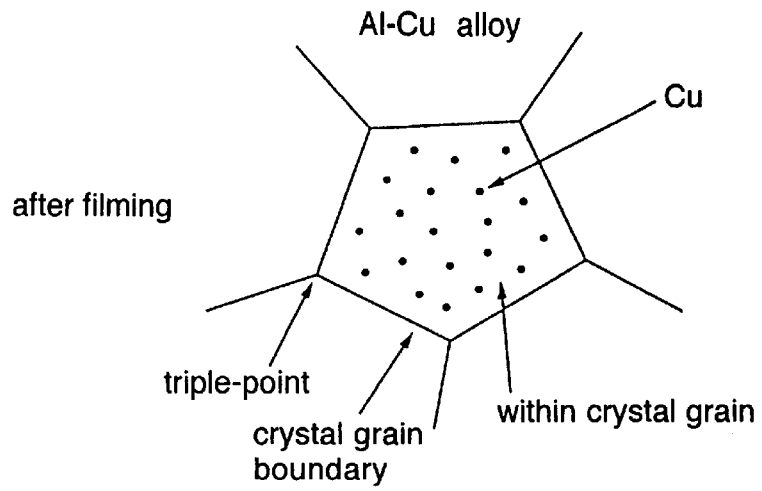
FIG. 4(a) is a schematic diagram showing a distribution state of a copper element within a crystal grain immediately after an aluminum-copper alloy film has been formed.
Figure 4B:
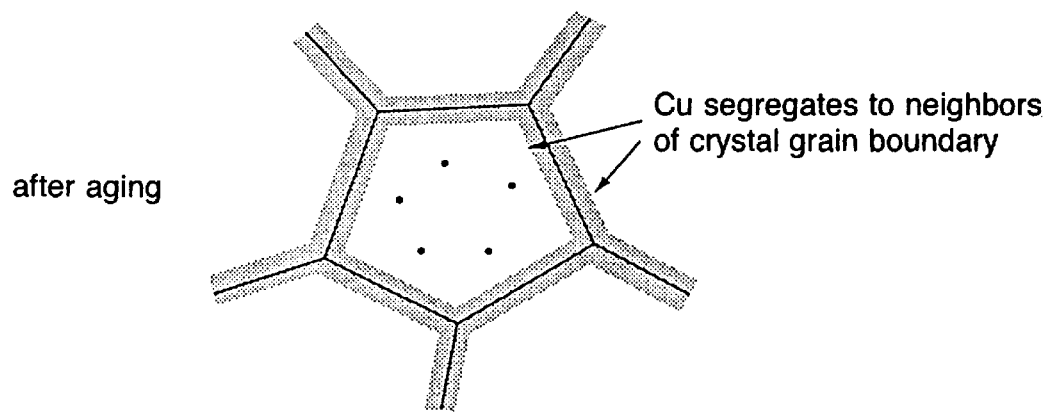
FIG. 4(b) is a schematic diagram showing a state in which a copper element segregates to a crystal grain boundary in a middle step when implementing an aging process to an aluminum-copper alloy film.
Figure 4C:
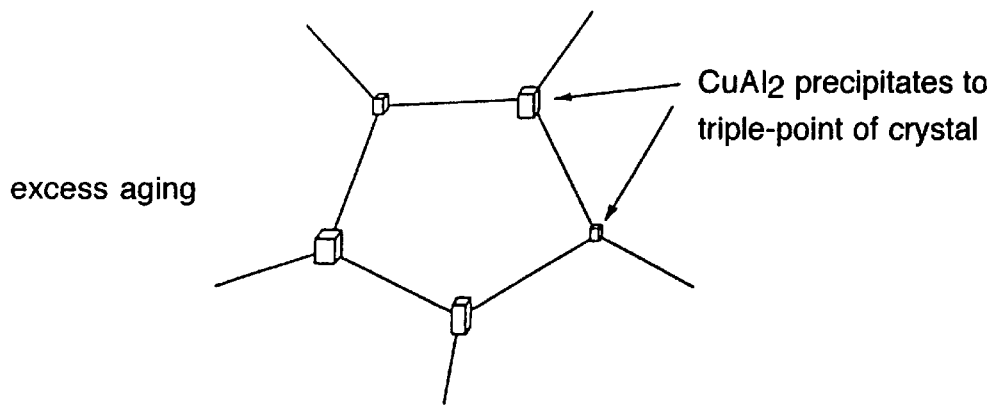
FIG. 4(c) is a schematic diagram showing a state in which copper elements segregated in the vicinity of a crystal grain boundary further precipitate to a triple point of a crystal boundary grain structure to form a more stable intermetallic compound, when the aging process is further continued.

Then, in order to verify the reasons for improvements in the power-durability, the aged electrode films have been analyzed. In FIG. 3, there are shown the results of measurements by the EDX (Energy Dispersive X-ray Spectroscopy) in respect of the X-ray intensities for copper elements within and in the vicinity of the crystal grain of the electrode films subjected to the aging under the temperature of 200° C. In the figure, the ordinate indicates a ratio of the copper element concentration in the neighbors of crystal grain boundaries to the copper element concentration within the crystal grain. Referring also to the results of the power-durability test shown in FIG. 2, it has been verified that, in the samples which have been subjected to the aging for a time between 5 and 50 hours that is the aging time with which the improvements of the life are recognized, copper or a doped element unevenly segregates to the neighbors of the crystal grain boundaries to possess the state shown in FIG. 4(*b*), and presenting a higher concentration of copper element than in the crystal grain. The samples which have been aged for 100 hours do not show any improvement in life and there is no segregation of copper element to the neighbors of the crystal grain boundaries. This fact is understood that, by continuing the aging process excessively, as shown in FIG. 4(*c*), the doped elements segregated to the neighbors of the crystal grain boundaries are converted into more stable intermetallic compounds, and, in the case of an aluminum-copper alloy, precipitated to the triple-points in the crystal grain structure, in the form of $CuAl_2$ which is called as theta phase.

Figure 8:
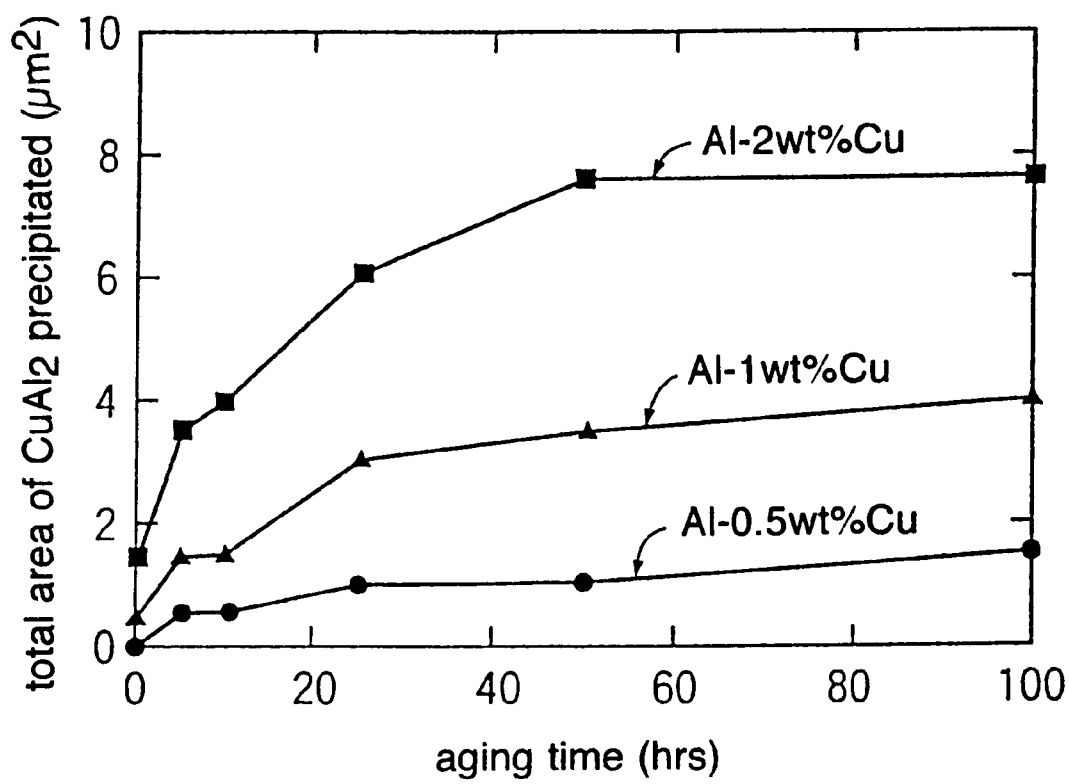
FIG. 8 is a diagram illustrating a relationship between an aging time in an aluminum-copper alloy electrode and an amount of the precipitated intermetallic compound.

FIG. 8 shows a relationship between the aging time under the processing temperature of 200° C. and the amount of the intermetallic compounds or $CuAl_2$ precipitated to the triple-points in crystal grain structure. Since $CuAl_2$ is difficult to measure quantitatively, measurement has been made in terms of an area of the compounds precipitated to the crystal grain boundary (the triple point) in the electrode film within an area of 15 micrometers-square. As can be seen from FIG. 8, the change in the amount of the precipitated $CuAl_2$ under the aging process at 200° C. differs from the changes in the cases of 200° C. shown in FIGS. 2(a), (b), (c). On the one hand, the change in the amount of the segregated Cu under the aging process at 200° C. in FIG. 3 is quite similar in the manner of the change to those under the aging process of 200° C. shown in FIGS. 2(a), (b), (c). More specifically, it has been verified experimentally that the intermetallic compound ($CuAl_2$) precipitated to the crystal grain boundary is not contributing to the power-durability, but the segregation of Cu shown in FIG. 3 is largely contributing to the power-durability.

Figure 1:
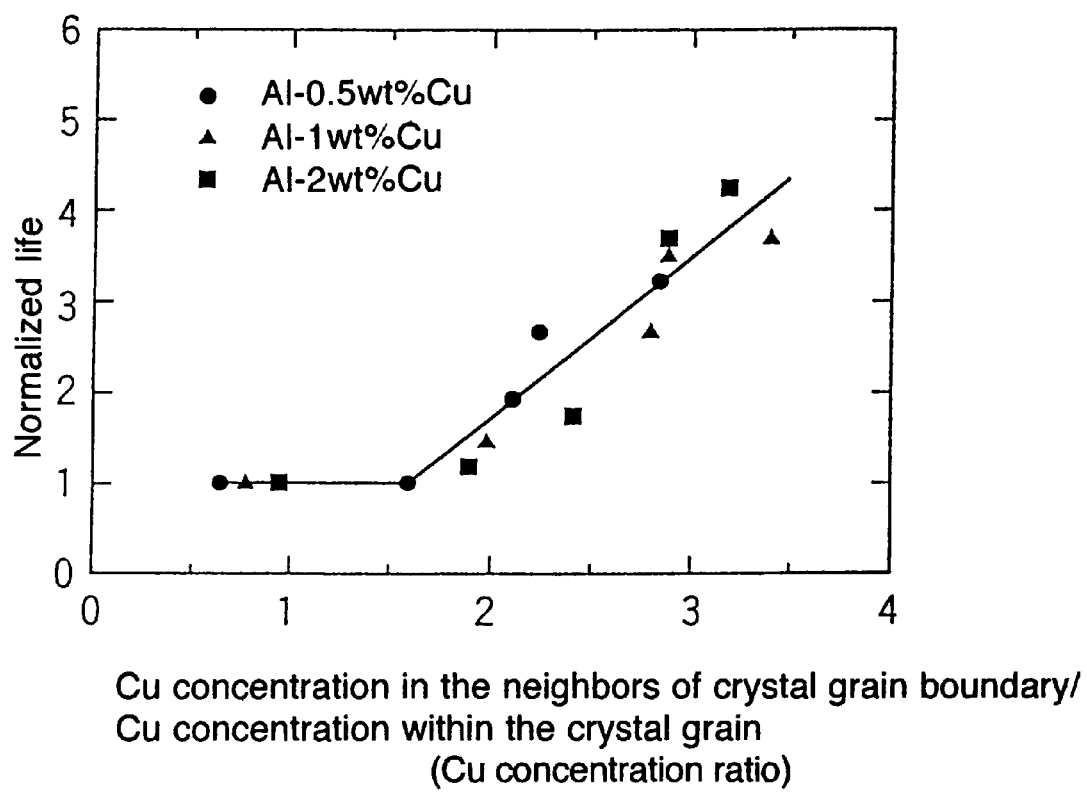
FIG. 1 is a diagram illustrating a relationship between a life characteristics of an electrode and a copper element concentration near a crystal grain boundary relative to a copper element concentration within a crystal grain in an aluminum-copper alloy film forming an electrode of a surface acoustic wave apparatus of the present invention.

In order for a better understanding of the above results, FIG. 1 shows the test results in terms of the ratio of the copper element concentration in the neighbors of the crystal grain boundaries to the copper element concentration within the crystal grain plotted along the abscissa, and the normalized life of the element plotted along the ordinate. As can be seen from this figure, when the ratio of the copper element concentration in the neighbors of the crystal grain boundaries to the copper element concentration within the crystal grain becomes larger than 1.6, there is an improvement in the normalized life. It should particularly be noted that with the ratio in the ranges of 2.2 to 2.9, the power-durability can be increased to an extent close to 2 to 3-fold as compared with that with out uneven precipitation. As apparent from the above description, it has been verified experimentally that the life of the surface acoustic wave apparatus or the power-durability of the electrode material can be improved by several times through the use of the alloy for the electrode material, wherein the alloy has concentrations of the doped element which are different between the areas within the crystal grain and in the neighbors of the crystal grain boundaries so that the concentration of the doped element is made higher in the neighbors of the crystal grain boundaries.

In the above described embodiments, a thermal aging process is carried out after the film of the electrode material is formed to have the concentration of the doped element which is different within the crystal grain and in the crystal grain boundaries, however, it should be noted that the present invention is not limited only to the method described with reference to the embodiment. Further, in accordance with the present invention, it is possible to use an alloy other than the aluminum-copper alloy as the electrode material. For example, it will be apparent to a person skilled in the art that in the similar results can be obtained in a manner similar to that described above, with an aluminum-titanium alloy, and other alloys having very low solid solution limits around the room temperature. According to the present invention, it is possible to use for the electrode material an aluminum alloy thin film which has conventionally been utilized, and it is possible by controlling a microstructure within the alloy to improve the power-durability of the surface acoustic wave apparatus.

As described above with reference to the embodiments, in the surface acoustic wave apparatus of the present invention, it is possible to improve the power-durability of the surface acoustic wave apparatus by several-times by having copper in the aluminum alloy film segregated in the neighbors of the crystal grain boundaries, comparing within the crystal grain. Further, by implementing an aging process in a manner that generation of intermettalic compounds or their aluminum-copper precipitation to the crystal grain boundaries can be suppressed, it is possible to control the microstructure such that the copper of the aluminum alloy film segregates in the neighbors of the crystal grain boundaries with the result that the power-durability can be improved several-fold.

Although the present inventions has been illustrated with reference to specific embodiments, the present invention is not restricted to the details of these embodiments, but rather the scope of the present invention includes the modifications and the changes recognized as within the ranges of apparatuses and methods described in the appended claims.

What is claimed is:

1. A surface acoustic wave apparatus, comprising:

a piezoelectric substrate; and an electrode consisting of an aluminum alloy film formed on a surface of said piezoelectric substrate and being doped with copper, wherein, said aluminum alloy film of the electrode includes a copper not being in a form of an intermetallic compound, and an element concentration of said copper is higher in neighbors of grain boundaries comparing to the one within a crystal grain, providing more copper element segregation in said neighbors of crystal grain boundaries rather than within the crystal grains.

2. A surface acoustic wave apparatus according to claim 1, wherein a ratio of a copper concentration in said neighbors of said grain boundaries to a copper concentration within said crystal grains in said aluminum alloy film is equal to or greater than 1.6.

3. A surface acoustic wave apparatus according to claim 1, wherein a ratio of a copper concentration in said neighbors of said grain boundaries to a copper concentration within said crystal grains in said aluminum alloy film is equal to or greater than 2.2.

4. A surface acoustic wave apparatus according to of claim 1, wherein said aluminum alloy film is an aluminum alloy film doped with a copper in a range from 0.5 wt % to 2 wt %.

5. A surface acoustic wave apparatus according to claim 1, wherein said surface acoustic wave apparatus is a multiple-mode type surface acoustic wave filter.

6. A surface acoustic wave apparatus, comprising:

a piezoelectric substrate; and an electrode formed on a surface of said piezo-electric substrate, wherein, said electrode consists of an alloy of film including an alloy base material and a dopant element having a small solid solution limit to said alloy base material, and wherein, there exists a dopant element not being in a form of an intermetallic compound, and a concentration of said dopant element is higher in neighbors of grain boundaries comparing to the one within crystal grains, with said dopant element segregating to said neighbors of crystal grain boundaries more densely than within the crystal grains.

* * * * *